US007600162B2

(12) United States Patent
Nishizawa

(10) Patent No.: US 7,600,162 B2
(45) Date of Patent: Oct. 6, 2009

(54) SEMICONDUCTOR DEVICE

(75) Inventor: Minoru Nishizawa, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 414 days.

(21) Appl. No.: 11/508,222

(22) Filed: Aug. 23, 2006

(65) Prior Publication Data

US 2007/0089009 A1 Apr. 19, 2007

(30) Foreign Application Priority Data

Aug. 24, 2005 (JP) ............................. 2005-243372

(51) Int. Cl.
*G11B 20/20* (2006.01)
*G11B 20/02* (2006.01)
(52) U.S. Cl. ........................ 714/700; 714/715
(58) Field of Classification Search .................. None
See application file for complete search history.

(56) References Cited

U.S. PATENT DOCUMENTS

| | | | | |
|---|---|---|---|---|
| 3,906,367 A | * | 9/1975 | Hoeschele et al. | 375/249 |
| 4,003,028 A | * | 1/1977 | Bennett et al. | 710/269 |
| 4,071,887 A | * | 1/1978 | Daly et al. | 710/305 |
| 4,468,767 A | * | 8/1984 | Warren et al. | 370/375 |
| 4,636,858 A | * | 1/1987 | Hague et al. | 348/463 |
| 4,999,709 A | * | 3/1991 | Yamazaki et al. | 348/589 |
| 5,027,349 A | * | 6/1991 | Thorne | 370/384 |
| 5,218,680 A | * | 6/1993 | Farrell et al. | 709/215 |
| 5,887,039 A | * | 3/1999 | Suemura et al. | 375/365 |
| 5,940,402 A | * | 8/1999 | Krakovyak | 370/461 |
| 2003/0120976 A1 | * | 6/2003 | Athanassiadis | 714/34 |
| 2005/0258856 A1 | * | 11/2005 | Kishimoto et al. | 324/765 |

FOREIGN PATENT DOCUMENTS

JP 63-39226 2/1988

* cited by examiner

*Primary Examiner*—Cynthia Britt
*Assistant Examiner*—Dipakkumar Gandhi
(74) *Attorney, Agent, or Firm*—McGinn IPLaw Group, PLLC

(57) ABSTRACT

A semiconductor device including an interrupt pattern generator for generating an interrupt enabling signal and interrupt data, an input buffer for receiving input serial data, a selector, receiving through-data serially output from said input buffer and serial data obtained on parallel-to-serial conversion of said interrupt data, for selecting and serially outputting said through-data when said interrupt enabling signal is in an inactive state, and for selecting and serially outputting said interrupt data when said interrupt enabling signal is in an active state, and a circuit exercising control for instructing said interrupt pattern generator to generate said interrupt data and to activate said interrupt enabling signal in case the information instructing the merging of said interrupt data in a predetermined position of said through-data is detected from said input serial data.

20 Claims, 4 Drawing Sheets

SEMICONDUCTOR DEVICE

FIELD OF THE INVENTION

This invention relates to a semiconductor device having a serial interface. More particularly, the present invention relates to a semiconductor device suited for testing.

BACKGROUND OF THE INVENTION

Recently, the operation frequency of semiconductor integrated circuits has been remarkably raised. For instance, in a serial interface, also termed 'SerDes Interface' or 'Advanced Memory Buffer', realizing high speed serial transfer in a gigabit range, such as DIMM (Dual Inline Memory Module), each channel includes a deserializer and a serializer. The deserializer recovers clock and data, synchronized with data which has been serially received by an input buffer to convert the recovered data into parallel data. The serializer converts the parallel data to be transmitted into serial data. In order to realize synchronized reception of the data among plural channels, frame synchronization patterns are periodically inserted at predetermined positions in the data serially sent from a sending side. The frame synchronization patterns are detected by the reception side to establish frame synchronization among plural channels.

FIG. 3 is a diagram showing the testing configuration of a semiconductor device having a conventional serial interfacing circuit. In a semiconductor device (chip) 10, shown in FIG. 3, N channels from a channel zero to a channel N, where N is an integer not less than 1, are each of the same configuration. Specifically, each channel of the chip includes an input buffer circuit 101, a serial-to-parallel converter (SP) 102, a frame synchronization circuit 103, a skew compensation circuit 107, a parallel-to-serial converter (PS) 104, a selector 106, and an output buffer circuit 105.

The input buffer circuit 101 is supplied with received serial data. The serial-to-parallel converter (SP) 102 converts the received parallel data, input to the input buffer circuit 101, into parallel data. The frame synchronization circuit 103 detects a frame synchronization pattern from parallel data output from the serial-to-parallel converter 102 to take frame synchronization among plural channels and acquires skew information in the channel at the time of the frame synchronization. The skew compensation circuit 107 is supplied with an interrupt enabling signal 110 and interrupt frame 111, generated by a pattern generator (interrupt pattern generator) 109', and also is supplied with the skew information 112 from the frame synchronization circuit 103 to compensate skew. It is noted that the skew information is the information on lag and lead of the synchronization timing of each channel relative to the frame synchronization timing among plural channels. The parallel-to-serial converter (PS) 104 is supplied with parallel data, skew of which has been compensated by the skew compensation circuit 107, and converts the parallel data into serial data.

The selector 106 is supplied with the serial data from the parallel-to-serial converter 104 and received serial data from the input buffer circuit 101. When the interrupt enabling signal having skew thereof compensated, indicates transmission serial data, the selector 106 selects and outputs the serial data from the parallel-to-serial converter 104 and, when the interrupt enabling signal having skew thereof compensated, indicates a through-frame (output of the input buffer circuit 101), the selector 106 selects and outputs the received serial data output from the input buffer circuit 101. The output buffer circuit 105 serially outputs an output of the selector 106 to a transmission line.

The chip includes, common to the respective channels, a pattern monitor 108 and a pattern generator 109'. The pattern monitor 108 receives frame-synchronized patterns, output from frame synchronization circuits 103 of respective channels, i.e., from channel zero to channel N, to carry out comparison and monitoring as to whether or not the so received patterns coincide with a pattern of expected values. The pattern generator 109' is adapted for generating the interrupt enabling signal 110 and the interrupt frame 111, based on a command issued from the pattern monitor 108.

It is noted that, in FIG. 3, a clock and data recovery circuit, not shown, for extracting clock and data from the input serial data, is provided between the input buffer circuit 101 and the serial-to-parallel converter 102, and that through-data are supplied to the selector 106 and data sampled and output by the clock and data recovery circuit, not shown, are supplied to the serial-to-parallel converter 102. A clock signal extracted by the clock and data recovery circuit, not shown, is similarly used as a clock signal for conversion in the serial-to-parallel converter 102.

A measurement device 20, such as an LSI tester, supplies a test pattern to the input buffer circuit 101 of the chip 10, as a device under testing (DUT). The measurement device 20 performs a variety of tests of the chip 10, such as pass/fail test (functional tests), AC test, or margin test, by comparing the pattern data, output from an output buffer circuit 105 of the chip 10, with a pattern of expected values.

For confirming whether or not interrupt has been generated, the serial data from the measurement device 20 is supplied to the input buffer circuit 101 of the chip 10. In this chip 10, interrupt data (interrupt frame) is merged into a through-frame (received serial data) by the selector 106 and the so merged data is serially output from the output buffer circuit 105. The measurement device 20 receives the merged data and performs measurement operation such as comparing the merged data received with the pattern of expected values.

Meanwhile, as a test for high-speed data transmission, there has been known a loop-back test for coupling data from a transmit unit to a receiver unit (Patent Document 1).

[Patent Document 1]
JP Patent Kokai Publication No. JP-A-63-39226

SUMMARY OF THE DISCLOSURE

Recently, the transfer frequency for serial data in a high-speed serial interface has been increased to the extent that the test frequency of an LSI tester cannot cope with the transfer frequency for high-speed serial data. Or, the cost of the tester used for coping with the transfer frequency for high-speed serial data would be prohibitive.

For this reason, it has not been possible to conduct tests for high-speed serial transmission or interrupts during field use.

If a high-speed test with the transfer rate of, for example, the GHz order, is to be carried out, expensive high-speed testers are needed, thus leading to increased test costs and product costs.

If a test is to be conducted in a loopback configuration, that is, if serial data from an output buffer circuit 105 of a given channel in a chip 10 is looped back to an input buffer circuit 101 of the same channel for comparison with the pattern of expected values by the pattern monitor 108, as shown in FIG. 4, it is possible for a low speed tester to cope with high speed serial transmission. However, it is not possible to insert interrupt frames into through-frames to carry out testing. The reason is that there is only one pattern generator 109' for plural channels of from channel zero to channel N, and that the loopback test uses one chip. Meanwhile, in the loopback test of FIG. 4, the result of decision (path/fail) is output from a terminal 11 of the chip 1.

A semiconductor device in accordance with one aspect of the present invention, comprises: an interrupt pattern generator for generating an interrupt enabling signal and interrupt data; an input buffer for receiving input serial data; a selector, receiving through-data serially output from said input buffer and serial data obtained on parallel-to-serial conversion of said interrupt data, for selecting and serially outputting said through-data when said interrupt enabling signal is in an inactive state, and for selecting and serially outputting said interrupt data when said interrupt enabling signal is in an active state; and a circuit exercising control for instructing said interrupt pattern generator to generate said interrupt data and to activate said interrupt enabling signal in case the information instructing the merging of said interrupt data in a predetermined position of said through-data is detected from said input serial data.

According to the present invention, the semiconductor device may also be provided with a circuit for inserting the information, instructing the merging of the interrupt data in the predetermined position of the through-data, into input serial data to be received by a counterpart device, and for sending the resulting input serial data to the counterpart device.

A semiconductor device according to the present invention includes, in each of a plurality of channels, an input buffer circuit for receiving serial data; a serial-to-parallel converter for converting serial data, received by said input buffer circuit, into parallel data; a frame synchronization circuit for detecting a frame for synchronization adjustment and for taking frame synchronization among plural channels; a skew compensation circuit for receiving skew information from said frame synchronization circuit and for compensating skew of an interrupt enabling signal and an interrupt frame; a parallel-to-serial converter for converting said interrupt frame from said skew compensation circuit into serial data; and a selector receiving the interrupt frame from said parallel-to-serial converter and a through-frame from said input buffer circuit for selecting and outputting said interrupt frame when the interrupt enabling signal from said skew compensation circuit is in an active state, and for selecting and outputting said through-frame from said input buffer circuit when the interrupt enabling signal is in an inactive state.

The semiconductor device further includes, common to the plurality of channels, a synchronization pattern generator for generating parallel data including a frame for synchronization adjustment, a start delimiter indicating the start of said frame for synchronization adjustment, a frame for confirmation of synchronization and an end delimiter indicating the end of said frame for confirmation of synchronization; an interrupt pattern generator for generating said interrupt enabling signal and said interrupt frame for supply to skew compensation circuit; a first pattern monitor for outputting a detection flag to said interrupt pattern generator on detection by said frame synchronization circuit of said start delimiter from the parallel data frame-synchronized by said frame synchronization circuit; said interrupt pattern generator receiving a detection flag from said first pattern monitor to generate said interrupt enabling signal and said interrupt frame; and a second pattern monitor for comparing a pattern obtained on merging through-data and interrupt data together with a pattern of expected values to output the comparison result.

In another aspect of the present invention, there is provided a test method employing at least two semiconductor devices. Each of the semiconductor devices includes an interrupt pattern generator for generating an interrupt enabling signal and interrupt data, and a selector receiving through-data, which is input serial data serially output unchanged, and serial data obtained on parallel-to-serial conversion of the interrupt data. he selector selects the through-data or the interrupt data when the interrupt enabling signal is in an inactive state or in an active state, respectively, and outputs the data selected. Each of the semiconductor devices also includes a circuit for exercising control for instructing the interrupt pattern generator to generate the interrupt data and to activate the interrupt enabling signal in case the information instructing the merging of the interrupt data in a predetermined position of the through-data has been detected from the input serial data, a circuit for inserting into the input serial data the information instructing the merging of the interrupt data in a predetermined position in the through-data, and a pattern monitor for comparing a pattern resulting from merging of the through-data and the interrupt data, output from the semiconductor device, with a pattern of expected values. The method according to the present invention includes a step of supplying the input serial data from one of the semiconductor devices to the other semiconductor device, and a step of the other semiconductor device instructing the interrupt pattern generator to generate interrupt data and to activate an interrupt enabling signal when the information instructing the merging of interrupt data in a predetermined position of the through-data has been detected from serial data received from the one semiconductor device. The method according to the present invention also includes a step of the selector of the other semiconductor device switching between the through-data and interrupt data, based on the interrupt enabling signal, to send a pattern resulting from merging the through-data and the interrupt data serially to the one semiconductor device, and a step of the one semiconductor device comparing the pattern resulting from merging the through-data and the interrupt data, sent from the other semiconductor device, with a pattern of expected values, and outputting the comparison result to a testing device.

The meritorious effects of the present invention are summarized as follows.

According to the present invention, the information instructing merging the interrupt data in a predetermined position in the through-data is inserted into the serial data and supplied to a counterpart device. On detection by the counterpart device of the information from the input serial data, the interrupt data is generated, and the interrupt enabling signal is activated to switch from the through-data to the interrupt data, whereby an interrupt test may be enabled as a loopback test.

According to the present invention, no costly high-speed tester is needed even in case of conducting a high-speed test of a serial interface to render it possible to reduce test cost or to prevent test costs from increasing.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
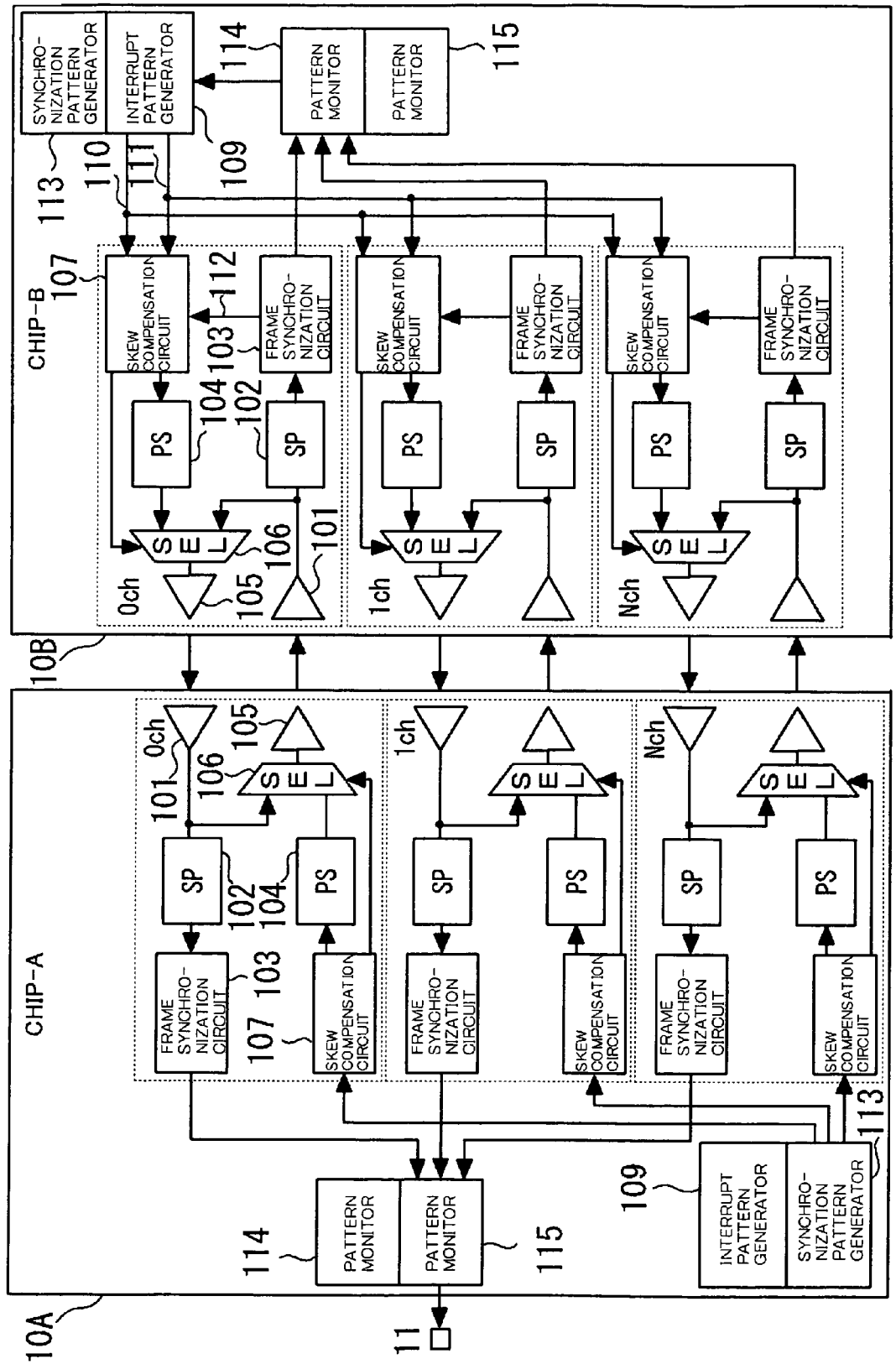
FIG. 1 is a block diagram showing the constitution of an embodiment of the present invention.

The present invention will now be described in further detail with reference to the accompanying drawings. Referring to FIG. 1, there are provided two semiconductor devices facing each other. Each of the semiconductor devices includes an interrupt pattern generator (109) for generating an interrupt enabling signal and interrupt data, and a selector (106) for receiving through-data from a path on which input serial data serially received is serially output unchanged, and serial data obtained on parallel-to-serial conversion of the interrupt data. The selector selects the through-data and the interrupt data when the interrupt enabling signal is in an inactive state and in an active state, respectively, and outputs the data selected. Each of the semiconductor devices also includes a circuit (114) for exercising control for instructing the interrupt pattern generator to generate the interrupt data and to activate the interrupt enabling signal in case the information instructing the merging of the interrupt data in a predetermined position of the through-data has been detected from the input serial data. Each of the semiconductor devices also includes a circuit (113) for inserting into the input serial data the information instructing merging the interrupt data in a predetermined position in the through-data, and a pattern monitor (115) for comparing a pattern resulting from merging through-data output and the interrupt data from the first semiconductor device with a pattern of expected values. It is possible to conduct a test on high-speed serial transfer, with a loopback test set-up, and a test on an interrupt frame obtained on merging the through-frame and the interrupt frame.

According to the present invention, input serial data is supplied, at the time of testing, from a first one to a second one of the two semiconductor devices, arranged facing each other.

When the second semiconductor device detects, from the serial data supplied from the first semiconductor device, the information instructing merging the interrupt data in a predetermined position of the through-data, the second semiconductor device instructs the interrupt pattern generator to generate the interrupt data and to activate the interrupt enabling signal.

The selector of the second semiconductor device switches between the through-data and the interrupt data, based on the interrupt enabling signal, to serially send a pattern resulting from merging the through-data and the interrupt data to the first semiconductor device.

The first semiconductor device compares the pattern, resulting from merging the through-data and the interrupt data, and which has been sent from the second semiconductor device, with a pattern of expected values, and outputs the result of decision on comparison to a testing device. A preferred embodiment of the present invention will now be described in more detail.

Figure 3:
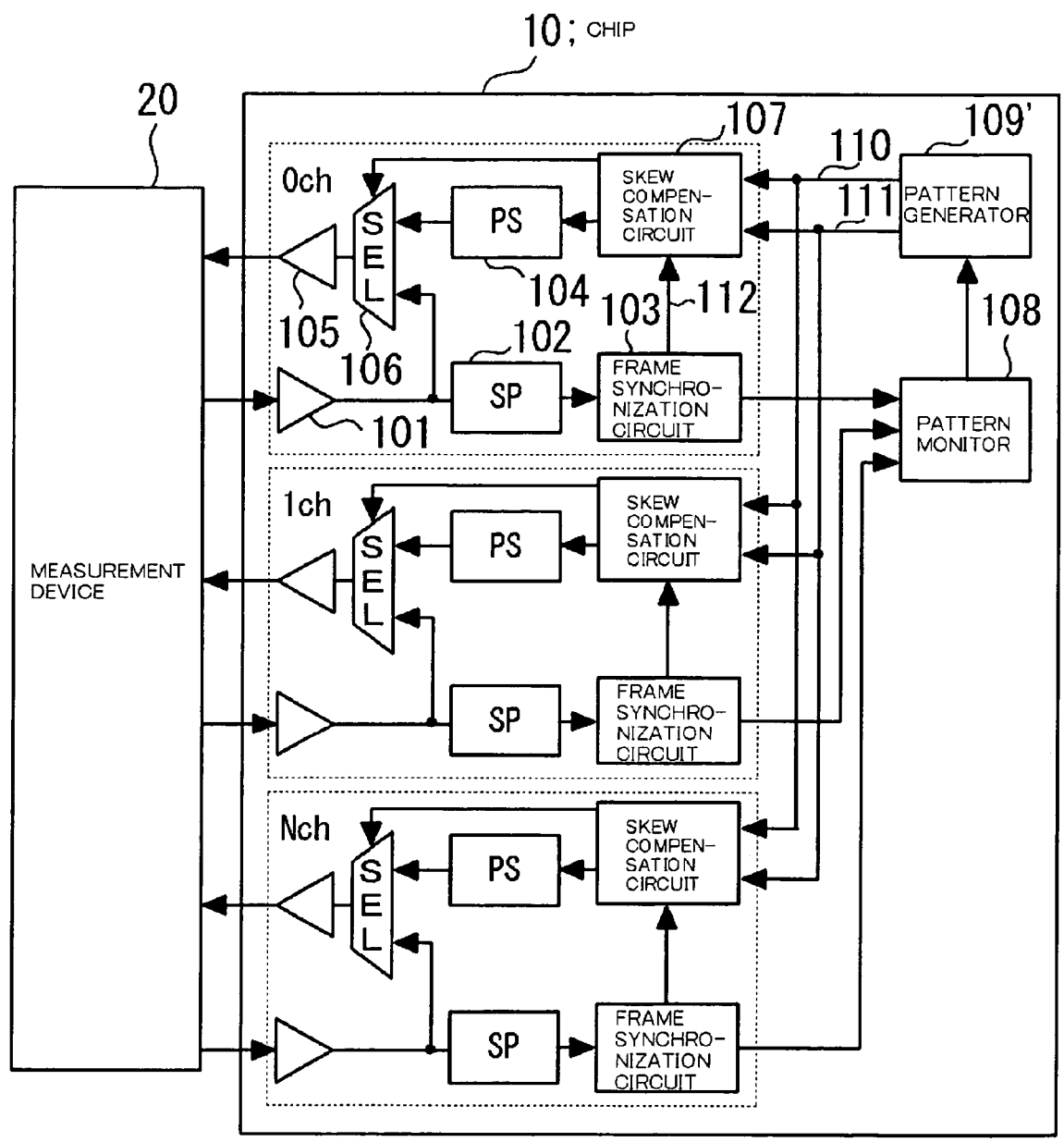
FIG. 3 is a block diagram showing a test setup for a conventional high-speed interfacing circuit.
Figure 4:
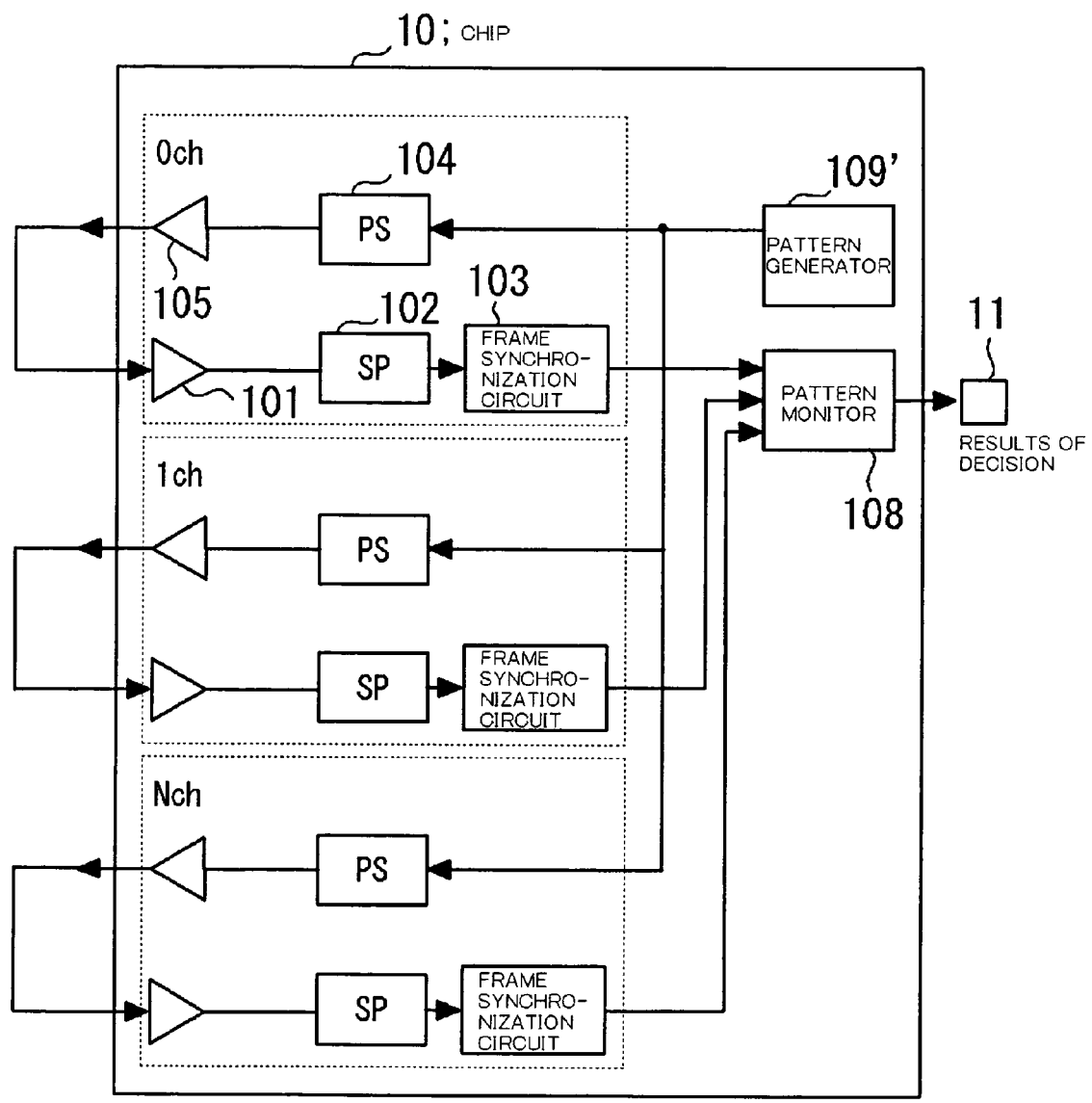
FIG. 4 is a block diagram for illustrating the loop back test of a conventional high-speed interfacing circuit.

FIG. 1 shows the constitution of an embodiment of the present invention. In FIG. 1, the same parts and components as those of FIG. 3 are depicted by the same reference numerals. Referring to FIG. 1, the present embodiment includes two chips A and B, that is, a chip 10A and a chip 10B. Each chip includes a synchronization pattern generator 113, an interrupt pattern generator 109, a first pattern monitor 114, and a second pattern monitor 115. The synchronization pattern generator 113 generates parallel data including a frame for synchronization adjustment, a start delimiter, a synchronization confirmation frame and an end delimiter. The interrupt pattern generator 109 generates an interrupt enabling signal 110 and an interrupt frame 111 (interrupt data). The first pattern monitor 114 compares the pattern of received data, generated by the synchronization pattern generator 113 of the counterpart chip and sent from the counterpart chip, with a pattern of expected values. The second pattern monitor 115 compares the pattern of the received data, sent from the counterpart chip and composed of the through-data and the interrupt data merged together, with a pattern of expected values. The configuration including the synchronization pattern generator 113, interrupt pattern generator 109, first pattern monitor 114 and the second pattern monitor 115, common to the plural channels, differs from the conventional constitution described with reference to FIG. 3, and constitutes one of the features of the present invention.

Each chip includes, at every channel, an input buffer circuit 101, a serial-to-parallel converter 102 for converting serial data, received by the input to the input buffer circuit 101, into parallel data, a frame synchronization circuit 103 for detecting a frame for synchronization adjustment for taking frame synchronization from one channel to another, a skew compensation circuit 107 for receiving the skew information 112 in frame synchronization in the frame synchronization circuit 103 for compensating the skew of the interrupt enabling signal 110 and the interrupt frame 111. By the skew information 112 is meant the skew of an own channel adjusted at the time of frame synchronization for all channels. Each chip also includes, at every channel, a selector 106 for receiving the interrupt enabling signal having skew thereof compensated by the skew compensation circuit 107, as a selection control signal, for switching between a through-frame from the parallel-to-serial converter 104 and a through-frame from the input buffer circuit 101, that is, serial data recovered by a clock and data recovery circuit, not shown. Meanwhile, in FIG. 1, as in FIG. 3, there is provided a clock and data recovery circuit, not shown, between the input buffer circuit 101 and the serial-to-parallel converter 102 for extracting clock and data from the input serial data. The through-data is supplied to the selector 106, and data sampled and output by the clock and data recovery circuit, not shown, is supplied to the serial-to-parallel converter 102. For a clock signal, used for conversion in the serial-to-parallel converter 102, the clock signal extracted by the clock and data recovery circuit, not shown, is used.

In the present embodiment, two chips of the same configuration are provided facing each other, as shown in FIG. 1. With this test set-up, an interrupt frame test for high-speed serial transmission on e.g. the GHz order may be conducted with a low-speed tester. This configuration constitutes one of the features of the present invention. In the following, it is assumed that the chip 10B is a device under test (DUT) and that the chip 10B is a reference device or a KGD (known good device) mounted on e.g. a load board of a tester. Of course, the chip 10A may be a DUT and test results may be sent from a terminal 11 of the chip 10A to the tester. The operation of the present embodiment will now be described with reference to FIG. 1.

In the chip 10A, the synchronization pattern generator 113 generates parallel data including a frame for synchronization adjustment, a start delimiter, a frame for confirmation of synchronization, and an end delimiter. The synchronization pattern generator 113 has the function of adding variably skew among plural channels.

The skew compensation circuit 107 of the chip 10A does not perform skew compensation. Specifically, the path which does not perform skew compensation is selected within the skew compensation circuit 107. The skew compensation circuit 107 receives parallel data from the synchronization pattern generator 113 and directly supplies the data to the parallel-to-serial converter 104 in the chip 10A.

The parallel-to-serial converter 104 in the chip 10A converts the parallel data from the synchronization pattern generator 113 to serial data which is supplied to the selector 106.

The selector 106 of the chip 10A selects the serial data from the parallel-to-serial converter 104 and supplies the so selected serial data to the input buffer circuit 101 of the relevant channel of the chip 10B.

In the chip 10B, the input buffer circuit 101 receives the serial data, sent from the chip 10A, and the serial-to-parallel converter 102 converts the serial data into parallel data. The frame synchronization circuit 103 detects the synchronization adjustment frame to take frame synchronization among plural channels.

On detection of the start delimiter from frame-synchronized parallel data, the pattern monitor 114 of the chip 10B sends the detected flag to the interrupt pattern generator 109 of the chip 10B.

On receipt of the detected flag, output from the pattern monitor 114, the interrupt pattern generator 109 of the chip 10B generates the interrupt frame 111, while generating, after lapse of a preset time interval, the interrupt enabling signal 110, to send the interrupt frame and the interrupt enabling signal to the skew compensation circuit 107 of the chip 10B.

The skew compensation circuit 107 of the chip 10B receives the interrupt frame from the interrupt pattern generator 109 and compensates the channel-to-channel skew, taken up by frame synchronization processing in the frame synchronization circuit 103 in the chip 10B, that is, compensates the skew in the own channel. The skew compensation circuit sends the interrupt frame having skew compensated, to the parallel-to-serial converter 104 of the chip 10B. The parallel-to-serial converter 104 then supplies the serial data to the selector 106.

Responsive to the interrupt enabling signal 110, the selector 106 of the chip 10B switches between the through-frame and the interrupt data from the parallel-to-serial converter 104.

The output buffer circuit 105 of the chip 10B sends the serial data, selected by the selector 106, to the input buffer circuit 101 of the relevant channel of the chip 10A.

In the chip 10A, the serial-to-parallel converter 102 converts the serial data, received by the input buffer circuit 101, into parallel data. The frame synchronization circuit 103 detects a frame for synchronization adjustment to take frame synchronization among plural channels.

The pattern monitor 115 in the chip 10A compares the patterns of through-frames with the pattern of expected values and, after detection of the start delimiter, compares the interrupt frames with the pattern of the expected values.

In this manner, the pattern monitor 115 gives a decision on both the through-frame and the interrupt frame, that is, a decision as to whether or not the through-frame and the interrupt frame received are coincident with the patterns of the expected values.

The results of decision in the pattern monitor 115 in the chip 10A are converted into a low-speed signal, which then is output at the output terminal 11. A low-speed tester, not shown, is able to conduct a test on e.g. pass/fail from the output value of the output terminal 11. Meanwhile, it is required of the low-speed tester to provide for high-speed transfer on the chips 10A and 10B. To this end, the clock signal, supplied to the chips from the tester, may have its frequency multiplied by a multiplier provided on a jig of the tester and the clock signal thus multiplied in frequency may then be supplied to the chip.

Figure 2:
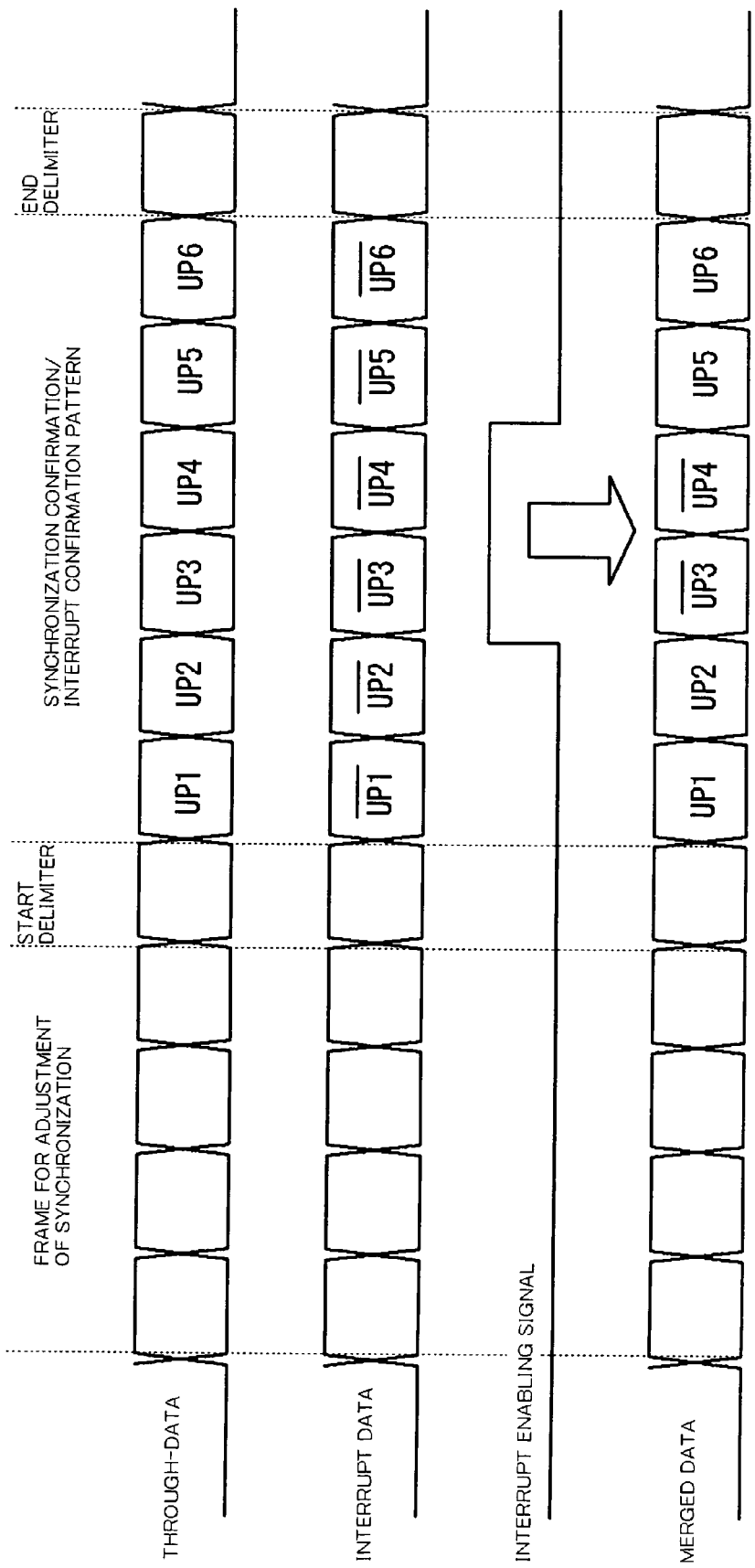
FIG. 2 is a timing chart for illustrating the operation of an embodiment of the present invention.

FIG. 2 is a timing diagram for illustrating the operation of an embodiment of the present invention shown in FIG. 1.

In the chip 10A, the synchronization pattern generator 113 generates parallel data, inclusive of a frame for synchronization adjustment, a start delimiter, a frame for confirmation of synchronization, and an end delimiter. The synchronization pattern generator 113 does not execute skew adjustment. Thus, the parallel-to-serial converter 104 performs parallel-to-serial conversion and the output buffer circuit 105 sends the resulting serial data to the input buffer circuit 101 of the relevant channel of the chip 10B.

Referring to FIG. 2, the through-data is the data which has been received by the input buffer circuit 101 of the chip 10B of FIG. 1 and which has been recovered by the clock and data recovery circuit, not shown. The through-data is received by the input buffer circuit 101 of the relevant channel of the chip 10A via selector 106 and output buffer circuit 105. The interrupt data is an interrupt frame output from the interrupt pattern generator 109 of the chip 10B. The interrupt enabling signal is the interrupt enabling signal 110 output from the interrupt pattern generator 109 of the chip 10B and which has skew compensated the skew compensation circuit 107. The merge data is composed of the interrupt data and the through-data, merged together by the selector 106 of the chip 10B, and which is supplied as input to the input buffer circuit 101 of the chip 10A.

In the chip 10B, the frame synchronization circuit 103 which has received the synchronization adjustment frame, sent from each channel of the chip 10A, takes frame synchronization. In the interim, the interrupt enabling signal is set to a low level in the chip 10B and the chip 10A receives the through-data from the chip 10B.

On detection of the start delimiter by the pattern monitor 114 of the chip 10B, the interrupt pattern generator 109 generates an interrupt frame 111 ($^-$UP1, $^-$UP2, ..., and $^-$UP6 of FIG. 2). Meanwhile, the start delimiter is a predetermined pattern instructing the start of a synchronization confirmation/interrupt confirmation pattern. After lapse of a preset time, the interrupt enabling signal 110 is set to a high level for a preset time duration. In FIG. 2, the interrupt enabling signal is set to a high level, with a pulse width twice the unit time period, with a delay time period twice the unit time as from detection of the start delimiter. During this time period, the selector 106 of the chip 10B selects and outputs interrupt data ($^-$UP3 and $^-$UP4) which are serial data output from the parallel-to-serial converter 104. When the interrupt enabling signal has changed from high to low, the selector 106 of the chip 10B selects through-data from the input buffer circuit 101 to terminate the sequence of the synchronization confirmation/interrupt confirmation pattern with detection of the end delimiter by the pattern monitor 114 of the chip 10B. In the embodiment shown in FIG. 2, the merge pattern, sent from the chip 10B to the chip 10A, is composed of through-data UP1 and UP2, interrupt data $^-$UP3 and $^-$UP4, obtained on switching, and data UP5 and UP6, which are through-data switched from the interrupt data.

After the through-data UP1 and UP2, following the detection of the start delimiter, the pattern monitor 115 of the chip 10A compares the interrupt data ⁻UP3 and ⁻UP4 with the pattern of the expected values. The pattern monitor then compares the through-data UP5 and UP6 with the pattern of the expected values, and outputs the result of comparison and decision to the output terminal 11.

With the use of at least two chips 10A and 10B, it is possible to generate two sorts of frames, namely the through-frames and interrupt frames, to enable a frame interrupt test with a loop-back test set-up.

Thus, according to the present invention, an output buffer and an input buffer of a high-speed serial interface are interconnected in a facing relationship and the decision of transmission/reception is carried out by the monitor circuit in a chip. Consequently, a frame interrupt test during a high speed operation may be conducted by a measurement device, such as a low-speed tester.

Although the present invention has so far been explained with reference to the preferred embodiment thereof, the present invention is not limited to the particular configuration of the embodiment illustrated. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
an interrupt pattern generator for generating an interrupt enabling signal and interrupt data;
an input buffer for receiving input serial data;
a selector, receiving through-data serially output from said input buffer and serial data obtained on a parallel-to-serial conversion of said interrupt data, said selector selecting and serially outputting said through-data when said interrupt enabling signal comprises an inactive state, and for selecting and serially outputting said interrupt data when said interrupt enabling signal comprises an active state; and
a control circuit to instruct said interrupt pattern generator to generate said interrupt data and to activate said interrupt enabling signal when a merging instruction is detected in said input serial data to merge said interrupt data in a predetermined position of said through-data.

2. The semiconductor device according to claim 1, further comprising a circuit for inserting the merging instruction of said interrupt data in the predetermined position of said through-data into said input serial data to be received by a counterpart device, and for sending the resulting input data to the counterpart device.

3. The semiconductor device according to claim 1, further comprising a pattern monitor to compare a pattern that results from merging output through-data and the interrupt data from a counterpart device with a predetermined pattern.

4. The semiconductor device according to claim 3, wherein a high-speed test is performed on a high-speed serial transfer via a loopback test set-up.

5. The semiconductor device according to claim 3, wherein a test is performed on an interrupt frame obtained via the merging of the through-frame and the interrupt frame.

6. The semiconductor device according to claim 1, further comprising a counterpart device,
wherein the semiconductor device and the counterpart device are arranged to face each other, and
wherein, at a time of testing, input serial data is supplied from one of the semiconductor device and the counterpart device to the other of the semiconductor device and the counterpart device.

7. The semiconductor device according to claim 6, wherein, when the device that receives the serial data detects the merging instruction, the device that receives the serial data instructs the interrupt pattern generator to generate the interrupt data and the interrupt enabling signal.

8. The semiconductor device according to claim 7, wherein the selector of the device that receives the serial data switches between the through-data and the interrupt data, based on the interrupt enabling signal, to serially send a pattern resulting from merging the through-data and the interrupt data to the first semiconductor device.

9. The semiconductor device according to claim 8, wherein a device that sends the serial data compares the pattern resulting from merging the through-data and the interrupt data, and which has been sent from the device that receives the serial data, with the predetermined pattern, and outputs the result of comparison to an external testing device.

10. A semiconductor device having a plurality of channels, each of the plurality of channels comprising:
an input buffer circuit for receiving serial data;
a serial-to-parallel converter for converting said serial data, received by said input buffer circuit, into parallel data;
a frame synchronization circuit for detecting a frame for synchronization adjustment and for transmitting frame synchronization among plural channels;
a skew compensation circuit for receiving skew information from said frame synchronization circuit and for compensating for a skew of an interrupt enabling signal and an interrupt frame;
a parallel-to-serial converter for converting said interrupt frame from said skew compensation circuit into serial data; and
a selector, receiving the interrupt frame from said parallel-to-serial converter and a through-frame from said input buffer circuit, for selecting and outputting said interrupt frame when the interrupt enabling signal from said skew compensation circuit is in an active state and for selecting and outputting said through-frame from said input buffer circuit when the interrupt enabling signal is in an inactive state,
wherein said semiconductor device comprises, common to the plurality of channels:
a synchronization pattern generator for generating parallel data including a frame for synchronization adjustment; a start delimiter indicating a start of said frame for synchronization adjustment; a frame for a confirmation of synchronization and an end delimiter indicating an end of said frame for confirmation of synchronization;
an interrupt pattern generator for generating supplying said interrupt enabling signal and said interrupt frame to said skew compensation circuit;
a first pattern monitor for outputting a detection flag to said interrupt pattern generator upon a detection by said frame synchronization circuit of said start delimiter from the parallel data frame-synchronized by said frame synchronization circuit, said interrupt pattern generator receiving the detection flag from said first pattern monitor to generate said interrupt enabling signal and said interrupt frame; and a second pattern monitor for comparing a pattern obtained upon a merging through-data and interrupt data together with a pattern of expected values to output a comparison result.

11. A semiconductor device system, comprising at least two semiconductor devices, each as set forth in claim 10, wherein in one of said semiconductor devices:

said synchronization pattern generator generates parallel data including the frame for synchronization adjustment, the start delimiter indicating the start of said frame for synchronization adjustment, the frame for confirmation of synchronization and the end delimiter indicating the end of said frame for confirmation of synchronization, said skew compensation circuit does not perform skew compensation;

said skew compensation circuit sends said parallel data to said parallel-to-serial converter for performing parallel-to-serial conversion;

said selector selecting serial data from said parallel-to-serial converter and outputting said selected serial data to the input buffer circuit of a relevant channel of the other of said semiconductor devices, facing said one semiconductor device, wherein in an other of said at least two semiconductor devices:

said input buffer circuit receives serial data, received by said one semiconductor device;

said serial-to-parallel converter converts the received serial data into parallel data;

said frame synchronization circuit detects a frame for synchronization adjustment to take frame synchronization among plural channels;

said first pattern monitor, on detection of said start delimiter from frame-synchronized parallel data, sends a detection flag to said interrupt pattern generator;

said interrupt pattern generator on detection of said detection flag generates an interrupt frame;

said interrupt pattern generator, after a lapse of a preset time, activates an interrupt enabling signal to send the interrupt enabling signal activated to said skew compensation circuit;

said skew compensation circuit cancels out channel-to-channel skew of said interrupt frame, taken up by synchronizing processing in said frame synchronization circuit, to send a resulting interrupt frame to said parallel-to-serial converter;

said parallel-to-serial converter sending serial data;

said selector switching between a through-frame and an interrupt frame, based on said interrupt enabling signal;

an output buffer circuit sending serial data, as selected by said selector, to the input buffer circuit of a relevant channel of said one semiconductor device, and wherein in said one semiconductor device:

said serial-to-parallel converter converts the serial data, received by said input buffer circuit, into parallel data;

said frame synchronization circuit detects a frame for synchronization adjustment, to take frame synchronization among plural channels;

said second pattern monitor compares a pattern of a through-frame with a pattern of expected values;

said second pattern monitor after a lapse of a preset time from detection of said start delimiter compares an interrupt frame with the pattern of expected values to give a decision on both the through-frame and the interrupt frame; and said second pattern monitor converts the result of decision into a signal of a lower speed to output said lower speed signal at an output terminal.

12. A semiconductor device system, comprising a first and a second semiconductor devices as set forth in claim 10, wherein in one of the first semiconductor device and the second semiconductor device, a respective synchronization pattern generator generates parallel data, inclusive of a frame for synchronization adjustment, a start delimiter, a frame for confirmation of synchronization, and an end delimiter, and wherein in the one of the first semiconductor device and the second semiconductor device, a respective parallel-to-serial converter converts the parallel data to serial data and the serial data is sent to an input buffer circuit of the other of the first semiconductor device and the second semiconductor device.

13. The semiconductor device system of claim 12, wherein in the other of the first semiconductor device and the second semiconductor device, the serial data from the input buffer is converted into parallel data, wherein, on detection of the start delimiter by a respective pattern monitor of other of the first semiconductor device and the second semiconductor device, the respective interrupt pattern generator generates an interrupt frame, wherein, after lapse of a predetermined time, an interrupt enabling signal is set to a high level for a preset time duration and a respective selector selects and outputs interrupt data from the respective parallel-to-serial converter and, when the interrupt enabling signal has changed from high to low, the respective selector selects through-data from the input buffer circuit to terminate a sequence of the synchronization confirmation/interrupt confirmation pattern with detection of the end delimiter by the pattern monitor.

14. The semiconductor device system of claim 12, wherein, in the other of the first semiconductor device and the second semiconductor device, on receipt of a detected flag being output from the pattern monitor, the respective interrupt pattern generator generates an interrupt frame and, after a lapse of a preset time interval, the interrupt enabling signal, to send the interrupt frame and the interrupt enabling signal to the skew compensation circuit, and wherein the respective skew compensation circuit receives the interrupt frame and compensates the channel-to-channel skew, taken up by frame synchronization processing in the frame synchronization circuit in a same channel.

15. The semiconductor device system of claim 14, wherein the skew compensation circuit sends the interrupt frame having a compensated skew, to the respective parallel-to-serial converter and the respective parallel-to-serial converter sends the serial data to the respective selector.

16. A method of testing one of a first semiconductor device and a second semiconductor device, each of which faces the other, the method comprising:

receiving input serial data, at a time of the testing, from one of the first and the second semiconductor devices;

selecting interrupt data upon receiving an interrupt signal and through-data when not receiving the interrupt signal;

merging the interrupt data into a predetermined position in the through-data using a control circuit; and comparing a pattern resulting from the merging with a pattern of expected values.

17. The method of claim 16, further comprising outputting a result of the comparing to an external testing device.

18. The method of claim 16, wherein the comparing further comprises one of the first semiconductor device and the second semiconductor device compares the merging performed by the other of the first semiconductor device and the second semiconductor device.

19. The method of claim 16, further comprising:
converting a result of the comparing to a low-speed signal; and
outputting the low-speed signal to an external testing device.

20. The method of claim 16, further comprising:
detecting a frame for synchronization adjustment;
taking frame synchronization between a plurality of channels provided on each of the first semiconductor device and the second semiconductor device;
receiving skew information of frame synchronization; and
compensating for the skew information of an interrupt enabling signal and an interrupt frame.

* * * * *